United States Patent

Yukami et al.

[15] 3,665,264

[45] May 23, 1972

[54] STRESS SENSITIVE SEMICONDUCTOR ELEMENT HAVING AN N+PP+ OR P+ NN+JUNCTION

[72] Inventors: Noboru Yukami, Hirakata; Hiroshi Otani, Shijonawate; Hideo Kurokawa, Neyagawa, all of Japan

[73] Assignee: Matsushita Electric Industrial Co., Ltd., Osaka, Japan

[22] Filed: Aug. 18, 1970

[21] Appl. No.: 64,696

[30] Foreign Application Priority Data

Sept. 1, 1969 Japan....................................44/70415

[52] U.S. Cl...................317/235 R, 317/235 M, 317/235 AJ, 317/235 AM, 179/110

[51] Int. Cl.........................................H01l 11/00, H01l 15/00

[58] Field of Search......................317/234, 235, 26, 48.1, 47, 317/48; 179/110, 100.2; 333/71; 338/2; 29/572

[56] References Cited

UNITED STATES PATENTS

| | | | |
|---|---|---|---|
| 3,215,568 | 11/1965 | Pfann | 317/235 |
| 3,236,957 | 2/1966 | Karmann et al. | 317/235 |
| 3,283,271 | 11/1966 | Persson | 317/235 |
| 3,320,568 | 5/1967 | Russell et al. | 317/235 |
| 3,351,824 | 11/1967 | Park | 317/235 |
| 3,514,846 | 6/1970 | Lynch | 317/235 |

*Primary Examiner*—John W. Huckert
*Assistant Examiner*—Andrew J. James
*Attorney*—Stevens, Davis, Miller & Mosher

[57] ABSTRACT

A stress sensitive semiconductor element comprising first and second low-resistivity regions of different conductivity types formed in a common semiconductor substrate, and a third region of a higher resistivity and of the same conductivity type as that of said first region, said third region being formed between said first and second regions in said common semiconductor substrate, and a constricted portion being formed at the non-rectifying contact between said first and third regions, wherein the length of said third region is longer than the effective diffusion distance of carriers; such a device having a good linear conversion characteristics and a high sensitivity, a wide range of application being expected for a high sensitivity microphone, various pick-up elements and switching elements.

7 Claims, 12 Drawing Figures

N. YUKAMI,
H. OTANI AND
H. KUROKAWA
INVENTORS

BY Stevens, Davis, Miller & Mosher
ATTORNEYS

STRESS SENSITIVE SEMICONDUCTOR ELEMENT HAVING AN $N^+PP^+$ OR $P^+NN^+$ JUNCTION

This invention relates to a stress sensitive semiconductor element, which has a high sensitivity and improved linearity.

Among the conventional stress-electricity transducer elements are those utilizing the piezo-resistance effect of a semiconductor bulk and those utilizing the stress-resistance effect of a PN junction.

The element utilizing the piezo-resistance effect of a semiconductor bulk is advantageous in that it exhibits a linear relationship between stress and resistance, but it has a drawback in that the sensitivity or degree of change of resistance with respect to stress is low.

With the element utilizing the stress-resistance effect of a PN junction, on the other hand, the resistance changes exponentially with stress so that the resistance is remarkably varied upon application of a stress in excess of a certain critical value. The critical value of stress is very close to the breakdown limit of the element per se. Technically, therefore, much difficulty is experienced in an attempt to put such a type of element to practical use. Furthermore, the resistivity of a semiconductor substrate in which such PN junction is formed is of very low value, and the PN junction is formed in the substrate in a position very close to the surface thereof. This is because a diffusion current flowing through the semiconductor substrate is utilized. Such an element finds only limited use due to the fact that the mode of imparting a stress to the PN junction is a point mode utilizing a saphire needle or the like and that the stress is limited to compression. Also, it is very liable to be influenced by external factors.

Accordingly, it is an object of this invention to provide a novel improved stress-electricity transducer element having only the advantages of those utilizing the piezo-resistance effect of a semiconductor bulk and those utilizing the stress-resistance effect of a PN junction, thereby solving the aforementioned problems. In principle, the element according to the present invention is based upon an entirely new idea.

Figure 1:
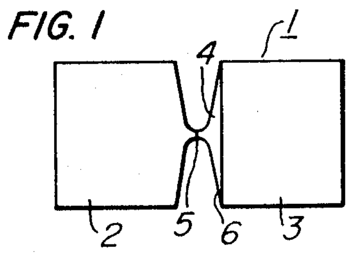
Figure 2:
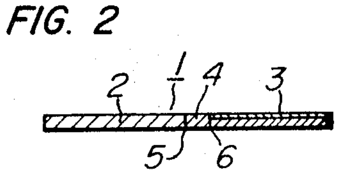
Figure 3:
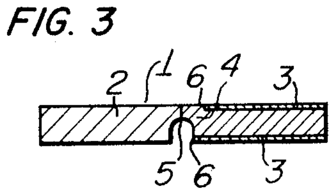
Figure 4:
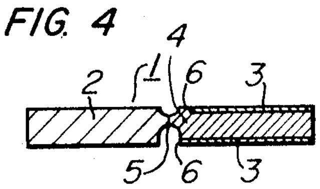
Figure 5:
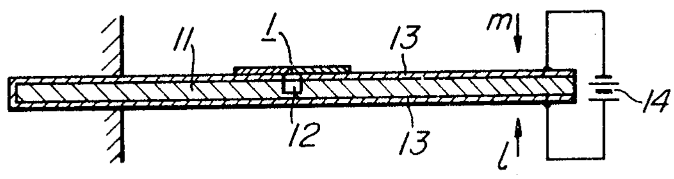
Figures 6, 7:
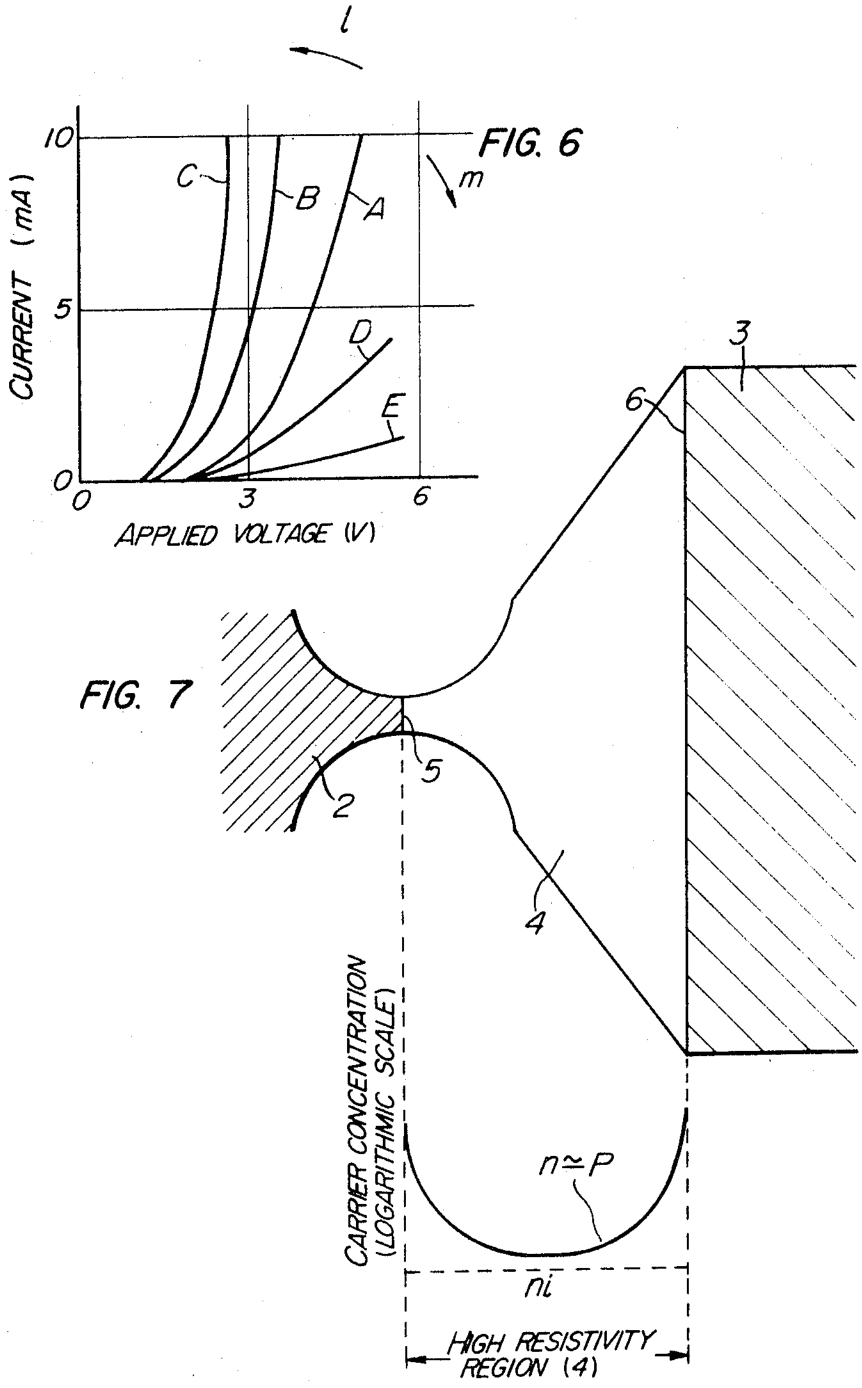

Other objects, features and advantages of the present invention will become apparent from the following description taken in conjunction with the accompanying drawings, in which:

FIG. 1 is a diagram for explaining a semiconductor stress transducer element embodying the present invention, FIGS. 2 through 4 show sectional views of various transducer elements, FIG. 5 is a view showing an example of a mode of application in which the element according to this invention is used, FIG. 6 is a diagram showing characteristic curves obtained with the arrangement of FIG. 5, FIG. 7 is a diagram illustrating the main portions of the element shown in FIG. 1, and FIGS. 8 through 12 are diagrams showing other representative embodiments of this invention.

Detailed description will now be made of the element according to the present invention. FIG. 1 shows the structure of the element, and FIGS. 2 through 4 show various sectional views, wherein numeral 1 represents a thin sheet-like silicon substrate 2000 microns in length, 1000 microns in width and 30 microns in thickness in the case of FIG. 2 and 100 microns in the case of FIGS. 3 and 4 which is constricted at the center thereof. The minimum width of the constricted portion is 50 microns. Numeral 4 indicates a P type region having a resistivity of several ohm-cm to several thousand ohm-cm, it adjoins a P type region 2 having a low resistivity at a junction 5 which is formed in the neighborhood of the center of the constricted part or in the vicinity of the center of the substrate 1. This region is formed by selectively diffusing boron into the substrate from one or both of the main surfaces of the substrate 1 as deep as nearly the thickness of the substrate. Numeral 3 denotes an N type region which is formed by diffusing phosphorus into the substrate 1 to a depth of several microns from one of the surfaces thereof as far as 850 microns from the rightmost end of the substrate as viewed in the Figures. The resistivity of this N type region 3 is 0.001 ohm-cm. FIG. 2 shows an example where the N type region is formed along one principal surface of the substrate 1, and FIGS. 3 and 4 show examples where the N type regions are formed along both principal surfaces. In FIG. 3, a groove formed along the junction 5 at one surface of the substrate 1 is shown, while in FIG. 4, grooves are provided at both surfaces.

The length of the region 4 formed in the center portion of the substrate 1 is selected to be longer or equal to the effective diffusion length of carriers. The sectional area of the center portion is extremely small due to the fact that the notch is formed in directions perpendicular to the longitudinal direction of the substrate 1 so that the electrical characteristics of the element are greatly affected by the surface recombination, with a result that the effective carrier diffusion length is shortened.

FIG. 5 shows a mode of use of the element, wherein numeral 11 represents an insulating plate having a groove 12 formed in one surface. A metal layer 13 provided on the two main surfaces and one side edge of the insulator 11 is divided into two sections by the groove 12. The substrate 1 as shown in FIG. 1 is soldered to the metal layer across the groove 12 in such a manner that the P type region 2 thereof is electrically connected with one of the metal layer sections and the N type region 3 with the other metal layer section. Nickel or gold-chrome alloy is previously evaporated onto the surfaces of the P type region 2 and N type region 3 each having a low resistivity. The insulating plate 11 is fixed at one end portion, and a DC power source 14 is electrically connected with the metal layer 13 in the forward direction with respect to the PN junction surface 5. The distance from the free end of the insulating plate 11 to the center of the groove 12 is 5000 microns.

With such an arrangement, if the free end of the insulating plate 11 is bent in a direction as indicated by *l*, a compressive force is imparted to the element 1, and if the free end is bent in a direction as indicated by *m*, a tensile force is imparted to the element. It should be noted that the force applied to the element is a uniaxial force and not a bending force.

If the cross section of the element is such as shown in one of FIGS. 8 through 12, the mode of use is different from that shown in FIG. 5. Namely, it is not necessary to apply a uniaxial force to the element, but sufficient sensitivity can be obtained only by applying a bending force to the element. Further, the insulating plate 11 shown in FIG. 5 is unnecessary.

More specifically, when the silicon element per se is fixed at one end thereof and force is applied to the free end in a direction denoted by *l*, the element 1 is bent with the center line 7 as a neutral axis. Thus, a compressive force is imparted to the upper part and a tensile force is applied to the lower part.

Figure 8:
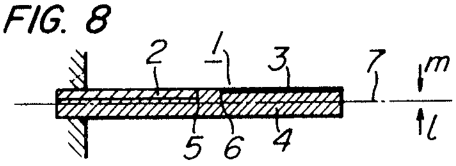
Figure 9:
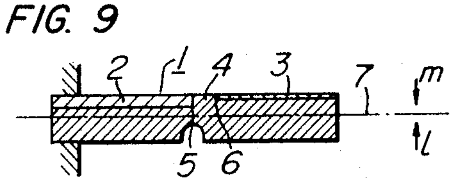
Figure 10:
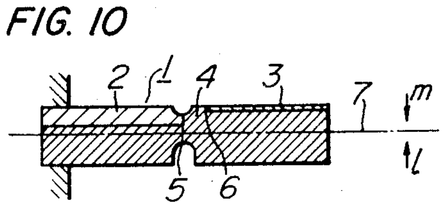

For example, if it is assumed in the element shown in FIG. 8 that the depth of the P type region 2 is 30 microns and the thickness of the element is 100 microns, the junction 5 will be positioned at one surface side of the neutral axis. Thus, when a force is applied to the free end in the direction denoted by *l*, a compressive force is imparted. Conversely, when a force in the direction denoted by *m* is applied, a tensile force will be imparted. Here, when a force is applied to the free end in the direction denoted by either *l* or *m*, the neutral axis receives no force and is neither compressed nor expanded.

Figure 11:
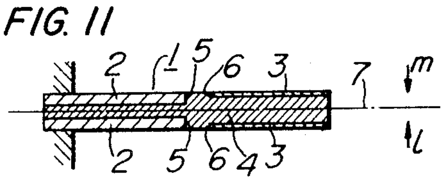
Figure 12:
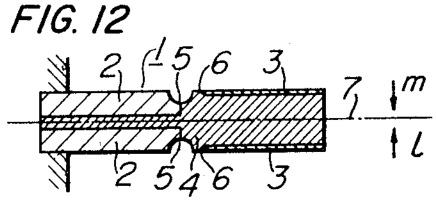

FIGS. 11 and 12 show the structure, wherein PN junctions are formed at both the upper and lower surfaces with respect to the neutral axis. For the same reason as described above, this structure is made symmetrical with respect to the neutral axis so that a tensile force may be imparted to one side when a compressive force is applied to the other.

In these Figures, the components corresponding to those shown in FIG. 1 are denoted by the same numerals.

FIG. 6 shows variations in the forward characteristics of the element 1 when a force is applied to the free end of the insulation plate 11 or the element 1 of FIGS. 8 through 12 wherein the curve A indicates the case where the force was Ogw, that is, no force was imparted to the element; the curves B and C indicate the cases where forces of 10 gw and 20 gw were applied in the direction indicated by $l$ respectively; and the curves D and E indicate the cases where forces of 10 gw and 20 gw were applied in the direction indicated by $m$ respectively.

As will be seen from these characteristic curves, the most important feature of the element according to the present invention is that the change of the current with respect to a predetermined stress depends upon the forward voltage so that the higher the voltage, the greater becomes the change of the current. In the case of the conventional element, on the other hand, a change of resistance or ratio of current change against a stress imparted to the PN junction remains substantially constant without depending upon a forward voltage. Thus, it will be readily apparent that the element according to the present invention is distinct from the conventional one in respect to its characteristics. Advantageously, the present element exhibits a greater resistance change than with the conventional element even in a range of very small stress. Furthermore, it is regardless of the direction of the stress.

The physical mechanism of the present element will now be explained with reference to an embodiment, wherein the substrate 1 is made of silicon and the region 4 of a high resistivity has a P type conductivity. If the power source is connected in such a way that a forward voltage is applied to the PN junction 6, holes are injected from the junction 5 at the constricted part into the region 4 and electrons are injected from the junction 6 into the region 4, causing so-called double injection phenomenon. Thus, a conductivity-modulated current flows through the region 4. In this case, the voltage ($V$) vs. current ($I$) characteristic is given by $$I = Ic\, V^{m} \qquad (1)$$

The current $Ic$ dependent upon the size of the element and the exponent $m$ of the voltage $V$ vary with stress. This variation is caused by the fact that the effective carrier diffusion length $L_e$ is changed. That is, since the current $Ic$ is given by a high order function of the effective diffusion length $L_e$, it is varied at a much higher rate than the rate of change of the effective diffusion length $L_e$. The exponent $m$ of the voltage $V$ is also varied with the effective diffusion length $L_e$. Thus, even if the voltage $V$ remains constant, the current $I$ is greatly varied with only a small variation of the exponent $m$. Equation (1) is represented by a straight line when it is plotted on a chart of a full logarithmic scale, and the slope of the straight line changes with a variation of the exponent $m$.

Thus, variations in the mobility $\mu$ and life time $\tau$ due to the stress result in a variation of the effective diffusion length of the carrier, since the effective diffusion length of the carrier is a function of the mobility $\mu$ and life time Y. As will be seen from the aforementioned reason, the current I is greatly affected by the variation of the effective diffusion length of the carrier. In this way, the sensitivity of the element is enhanced. In fact, the value of the exponent m is varied between 1 and 6 with the stress.

For reference, description will be made of the conventional PN junction. The relationship between current ($I$) and voltage ($V$) is given by $$I = q\left(\frac{D_p p_n}{L_p} + \frac{D_n n_p}{L_n}\right)\left(e^{qV/KT} - 1\right) \qquad (2)$$

where $I$: current $V$: voltage $P_n$ : minority carrier (the number of holes in the N type region)

$n_p$ : minority carrier (the number of electrons in the P type region)

$D_p$, $D_n$ : diffusion coefficients of the hole and electron respectively $L_p$, $L_n$ : diffusion lengths of the hole and electron respectively $q$ : electric charge $k$ : Boltzman's constant In the case where variations of the diffusion current as represented by Equation (2) are utilized, the quantities of the minority carriers or the values of $P_n$ and $n_p$ are changed upon application of a stress, so that the current $I$ is changed. The change of the current is not started until the stress reaches a value near to the breakdown limit of the element per se, as described above.

Comparison of Equations (1) and (2) evidently shows that the physical mechanisms for the variations in the current I with a stress represented by these two equations are basically different from each other. In the case of Equation (1), the factor $Ic$ is a high order function of the effective diffusion length of the carrier, and the exponent m of the voltage $V$ also varies with a stress. From this, it will be appreciated that the current varying mechanism represented by Equation (1) is more advantageous for a transducing element.

Description will now be made of the advantages of the construction wherein the element is constricted at the center portion thereof as described above. The carrier concentration distributes in the high resistivity region 4 in such a way as shown in FIG. 7, wherein $p$ and $n$ denote the concentration of holes and electrons and $n_i$ denotes the concentration of carriers intrinsic to the region 4. As seen from the Figure, a gradient of concentration appears in the vicinities of the junctions 5 and 6. Since the constricted part is formed around the junction 5, mechanical strain appears only near the junction 5 and the effect of stress only has to be considered with respect to the vicinity of the junction 5.

As to the movement of carriers near the junction 5 in the region 4, holes move from the junction 5 to the junction 6 due to diffusion and drift. On the other hand, electrons move in the same direction as holes due to diffusion and in the opposite directions with respect to holes due to drift. When a compressive force is applied to this part, the mobility $\mu_p$ of holes increases, and both the diffusion and drift currents due to holes increase. Though the mobility $\mu_n$ of electrons decreases, the electron current does not substantially change due to the fact that the drift current and the diffusion current flow in opposite directions. Accordingly, though the mobilities of holes and electrons change oppositely by stress, the change of current is mainly governed by the hole current. As described hereinabove, the constricted part plays an important role in selectively extracting the change of holes by stress and enhancing the sensitivity of the element. When the regions 2 and 3 have N and P type conductivities, respectively, and the region 4 has a high resistivity of N type conductivity, the change of current is mainly due to electrons.

As to the axial direction of the crystal, it has been experimentally confirmed that the highest possible sensitivity can be achieved by applying a stress to the element by flowing a current in the direction of the [111] axis in the case where use is made of an P type silicon substrate as in FIG. 1. This is completely different from the case of the conventional PN junction. It is deduced that the most suitable axial direction is the direction of the [100] axis in such a construction that use is made of a N type silicon substrate, a low resistivity N type region is formed by deeply diffusing phosphorus into the region 2 and a low resistivity P type region is formed by shallowly diffusing boron into the region 3. In this case, however, the decrease or increase in the current with the stress is reverse to that described above.

As described above, in accordance with the present invention, there is provided a stress converting element wherein a high resistivity region is provided between two regions of different conductivity types and in contact therewith, the distance between the two junctions being equal to or longer than the effective diffusion length of the carrier and a junction of regions having the same conductivity type but different resistivities is formed at the constricted part. The sectional area of the most constricted part should preferably be 5000 square microns or less taking such conditions as surface combination into account. In practice, however, it is preferably 3000 square microns or less. From the standpoint of the manufacturing technique, the lower limit of the sectional area is several hundred to one thousand square microns. If the sectional area is less than this range, difficulty will be encountered in the manufacture, thus resulting in lower accuracy.

With the present element, it is possible to achieve a sensitivity which is remarkably higher than, say 10 to 1000 times of that of the conventional one utilizing the piezo-resistance effect of a bulk, in a range of a small stress. In the conventional element wherein a stress is imparted to the PN junction, it is required that a high stress close to the breakdown limit be applied as an initial stress. This makes it very difficult to utilize such an element as a practical device. Therefore, the conventional element described above has never been provided as an actual product. In contrast, the element according to the present invention requires no initial stress. Thus, the present element has such advantages that it can be very easily manufactured on a mass production basis.

A further advantage of the present element is that the resistance between the terminals is varied linearly with the stress.

Furthermore, when the substrate is made of N type silicon and the crystal axis in the longer direction or the direction in which stress is applied is [100] axis, the resistance increases due to a compressive force. The mechanical strength of such a substrate is about ten times larger for a compressive force than for a tensile force. Thus, the range of its applicability is widened. Since N type silicon of [100] axis having high purity and high resistivity can easily be obtained, this invention makes it possible to provide an element having a large mechanical strength and remarkable characteristics.

What we claim is:

1. A mechanical stress sensitive semiconductor element, comprising: a semiconductor substrate having formed therein a first region of a first conductivity type, a second region of a second conductivity type, and a third region of the same conductivity type as said first region, said third region being formed in said substrate between said first and second regions and having a higher resistivity than said first and second regions; a non-rectifying first junction formed between said first and third regions; a second junction formed between said second and third regions; wherein the length of said third regions between said first and second junctions is not less than the effective diffusion length of charge carriers in said semiconductor element; and wherein said substrate further comprises a constricted portion in the area immediately adjacent said first junction.

2. A semiconductor element according to claim 1, wherein at least one of said first and second regions extends from one major surface of the semiconductor substrate to the opposite major surface.

3. A semiconductor element according to claim 1, wherein said first junction extends at right angles to the direction of current flow through said element.

4. A semiconductor element according to claim 1, wherein said first junction is located at the most constricted part of said semiconductor substrate.

5. A semiconductor element according to claim 1, wherein said first region and said second region are arranged on a first major surface of said semiconductor substrate.

6. A semiconductor element according to claim 5, wherein said third region is formed by said semiconductor substrate; and further comprising electrodes in ohmic contact with said first region and said second region and means, including a DC power source connected between said electrodes, for supplying the junction between said semiconductor substrate and said second region with a forward current.

7. A semiconductor element according to claim 5, wherein a further first region and a further second region are provided on the major surface opposite said first major surface of said semiconductor substrate, and wherein the further third region separating said further first and second regions is formed by the semiconductor substrate.

* * * * *